(12) United States Patent
Terui et al.

(10) Patent No.: US 6,618,889 B1
(45) Date of Patent: Sep. 16, 2003

(54) DISK-SHAPED WORKPIECE WASHING APPARATUS

(75) Inventors: Yoshinobu Terui, Ayase (JP); Hiroji Sato, Ayase (JP); Noriaki Mizuno, Ayase (JP)

(73) Assignee: Speedfam Clean System Co., Ltd, Ayase (JP)

( * ) Notice: Subject to any disclaimer, the term of this patent is extended or adjusted under 35 U.S.C. 154(b) by 425 days.

(21) Appl. No.: 09/651,252

(22) Filed: Aug. 30, 2000

(30) Foreign Application Priority Data

Nov. 17, 1999 (JP) ............................. 11-326973

(51) Int. Cl.[7] ........................ A47L 25/00; A47L 15/00
(52) U.S. Cl. .................... 15/77; 15/88.2; 15/88.3; 15/102; 134/902
(58) Field of Search ............... 15/77, 88.2, 88.3, 15/102; 134/902

(56) References Cited

U.S. PATENT DOCUMENTS

| 5,727,582 A | * | 3/1998 | Terui | 134/140 |
| 5,868,857 A | * | 2/1999 | Moinpour et al. | 134/6 |
| 5,933,902 A | * | 8/1999 | Frey | 15/102 |
| 6,055,694 A | * | 5/2000 | Steere | 15/77 |

FOREIGN PATENT DOCUMENTS

| JP | 9-206705 | 12/1997 |
| JP | 10-80668 | 3/1998 |

* cited by examiner

*Primary Examiner*—Robert J. Warden, Sr.
(74) *Attorney, Agent, or Firm*—Oblon, Spivak, McClelland, Maier & Neustadt, P.C.

(57) ABSTRACT

The washing apparatus is based on a process comprising the steps of extracting a plurality of workpieces W to be washed from rows of workpieces arranged longitudinally and at certain intervals in a carrier 10 at intervals of a plurality of workpieces by means of a plurality of lifting arms 21*a* and 21*b*; lifting the thus extracted workpieces to respective washing positions at alternately high and low heights; holding the thus lifted workpieces W from both sides thereof by means of rotating pairs of washing rollers 3*a* and 3*b*; scrubbing the works in a washing solution 2 by the use of the washing rollers 3*a* and 3*b* while forcedly rotating with the driving belt 34 by pressing the works against the driving belt 34 under the action of the rotational force of the washing rollers 3*a* and 3*b*; and the workpieces in the carrier 10 are washed by repeating these steps a plurality of times.

11 Claims, 6 Drawing Sheets

DISK-SHAPED WORKPIECE WASHING APPARATUS

TECHNICAL FIELD

The present invention relates to an apparatus for washing a substantially disk-shaped workpiece such as a magnetic disk substrate, an optical disk substrate, a silicon wafer, or a glass wafer.

RELATED ART

A scrubbing-type washing apparatus for washing a substantially disk-shaped workpiece by means of a roll-shaped washing member is known as those disclosed, for example, in Japanese Unexamined Patent Application Publications Nos. 9-206705 and 10-80668. These washing apparatuses wash the workpiece by bringing the both surfaces of the workpiece into contact with washing rollers while causing forced rotation of the workpiece by supporting the outer periphery of the workpiece by a plurality of driving rollers and spraying a washing solution from a jet nozzle on the workpiece.

However, the conventional washing apparatus using washing rollers is of a type in which workpieces are washed while feeding the workpieces one by one to the washing section, resulting in the disadvantage of poor throughput. For example, when washing 50 workpieces, the period from the start of washing of the first workpiece to the completion of washing of the 50th workpiece is very long, and when the preceding process is a batch processing process treating a large number of workpieces at once, this tends to result in a reduction in quality such as deterioration of the machined surfaces of the workpieces while waiting for washing.

DISCLOSURE OF THE INVENTION

A main technical object of the present invention is to provide an efficient and productive roller-type washing apparatus which permits simultaneous washing of a plurality of workpieces.

To achieve the aforementioned object, the invention provides a disk-shaped-workpiece washing apparatus comprising a carrier which holds a plurality of disk-shaped works in a longitudinal arrangement at predetermined intervals, a washing section which scrubs the workpieces held by the carrier sequentially in groups of a plurality of the workpieces, and an intermittent transfer mechanism, wherein the washing section comprises a lifting mechanism which removes the plurality of workpieces to be washed from the row of workpieces held by the carrier in groups of a plurality of the workpieces to corresponding washing positions, driving means which are provided at the corresponding washing positions, and forcedly cause the workpieces to rotate around the axes lines by coming into contact with the upper outer periphery of the lifted workpiece, and a pair of drivable and rotatable washing rollers provided for each of the washing positions which washes each workpiece while holding each rotating workpiece in between from the both sides thereof.

In the washing apparatus of the invention having the aforementioned configuration, the plurality of workpieces held in parallel on the carrier are lifted to the washing position by the lifting mechanism in groups of a plurality of the workpieces, and each workpiece is scrubbed and washed by the pair of washing rollers. Upon the completion of washing of a first group of workpieces, the carrier is moved by the spacing of the workpieces arranged in parallel, and washing of a second group of the workpieces is conducted in the same manner as above. By repeating the same operations a prescribed number of times, washing of all the works held by the carrier is completed.

According to the invention, as described above, advantages are provided in that it is possible to sequentially wash a plurality of works with washing rollers having a diameter larger than the spacing of the workpieces arranged in parallel by washing the plurality of works held at small spacings in a carrier by extracting the workpieces in groups of a plurality of the workpieces, thus achieving a higher throughput with a very high efficiency and an excellent productivity as compared with the conventional art of washing workpieces while transferring the workpieces one by one.

According to a preferred embodiment of the invention, the washing positions of the plurality of workpieces are alternately provided at different heights, the driving means and the washing rollers at each washing position are also arranged alternately at different heights, and adjacent washing rollers at adjacent washing positions overlap each other one above the other.

As a result, the spacing between adjacent washing positions can be reduced, and more workpieces can be washed at one time.

According to another preferred embodiment of the invention, each pair of washing rollers provided at each washing position is arranged horizontally at a position crossing the center portion of the workpiece in the diameter direction, and serves as pressing means for pushing up the workpiece and pressing the workpiece against the driving means by the use of a rotational force acting during washing.

As a result, it is no longer necessary to provide a special supporting roller rotatably supporting the workpiece during washing, leading to a washing apparatus of a simpler configuration.

According to a concrete embodiment of the invention, the washing apparatus has a washing tank filled with a washing solution, and the carrier and the washing rollers are immersed in the washing solution in the washing tank so as to permit washing of the workpiece in the washing solution.

According to a preferred concrete embodiment of the invention, the driving means comprises an endless driving belt arranged so as to come into linear contact with the upper-end outer periphery of the lifted workpiece along the circumference thereof.

According to another preferred concrete embodiment of the invention, the lifting mechanism is provided with a plurality of lifting arms, which synchronously moves up and down, arranged at predetermined intervals under the position where the carrier is provided in the washing section, and a supporting groove engaging with the outer periphery of the lower end of the workpiece held upright by the carrier is provided at the upper end of each lifting arm.

DETAILED DESCRIPTION OF THE INVENTION

Figure 1:
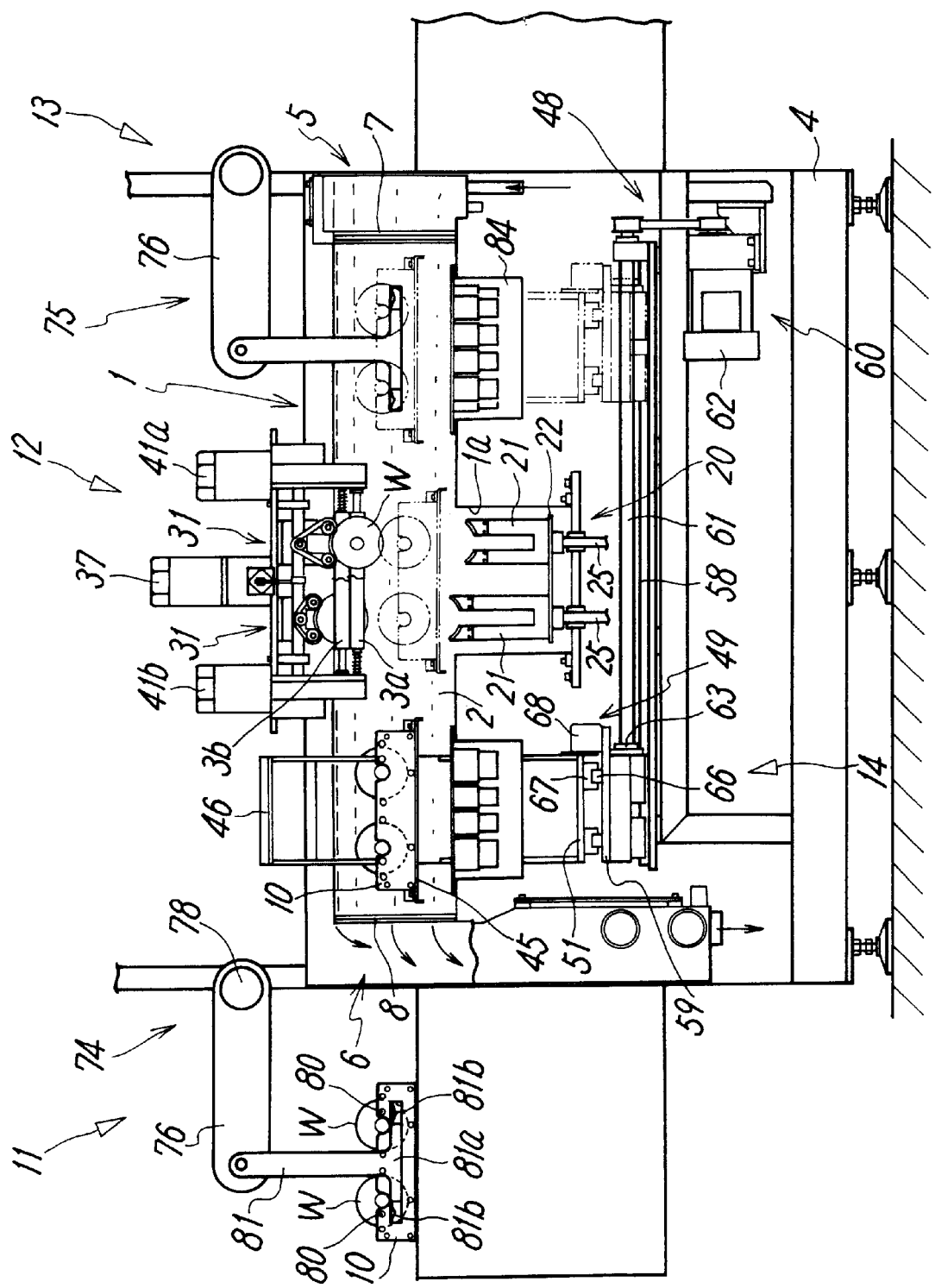
FIG. 1 is a sectional view schematically illustrating the washing apparatus of the present invention.

Preferred embodiments of the present invention will now be described in detail with reference to the drawings. In the washing apparatus of the embodiments shown, disk-shaped workpieces W are scrubbed by means of washing rollers 3a and 3b in a flow of a washing solution 2 flowing in a washing tank 1 from one side to the other in the transverse direction.

The above-mentioned washing apparatus has the washing tank 1 supported by an apparatus body 4. This flowing-liquid-type washing tank 1 is substantially groove-shaped. An end of the washing tank 1 has a solution feeding section 5 for feeding a washing solution 2, and the other end has a solution discharge section 6 for discharging the washing solution 2. The washing solution 2 comprising pure water, a detergent solution, or a chemical solution continuously flows from the solution feeding section 5 to the solution discharge section 6. The bottom of the washing tank 1 is slightly inclined so that the solution discharge section 6 side is lower in height than the solution feeding section 5 side.

Rectifying mechanisms 7 and 8 comprising porous plates are provided at the solution feeding section 5 and the solution discharge section 6, respectively, so that the flow of the washing solution 2 is substantially uniform over the entire depth of the solution.

The rectifying mechanism 7 for the solution feeding section 5 is formed by sequentially arranging a plurality of perforated plates or fiber plates having different porosities. A substantially uniform flow velocity is achievable over the entire solution depth by feeding the washing solution in a pressurized state from the solution feeding section 5, which is closely through these fiber plates.

The rectifying mechanism 8 for the solution discharge section 6 is, on the other hand, formed of perforated metal plates having a plurality of liquid flowing holes pierced therein so that a part of the washing solution 2 overflows at the upper end of the perforated plates, and the remaining solution flows through the liquid flowing holes to the solution discharge section 6.

While the washing solution 2 may be fed constantly from a solution source to the solution feeding section 5, the washing solution can be recirculated by connecting a solution feeding mechanism having a purifying function of the washing solution 2 between the solution feeding section 5 and the solution discharge section 6, collecting the used washing solution 2 from the solution discharge section 6, purifying the collected solution, and feeding the thus purified solution to the solution feeding section 5.

A loading section 11 for feeding a plurality of workpiecess W to be washed, held by a carrier 10, into the washing tank 1 for each run of the carrier 10, a washing section 12 sequentially extracting a plurality of the workpieces W in the carrier 10 and washing the thus extracted workpieces, an unloading section 13 for removing the washed workpieces W, together with the carrier 10, and a transfer mechanism 14 transferring the carrier 10 between these sections are provided in the washing tank 1 sequentially from the downstream side of the flow of the washing solution 2.

Figure 3:
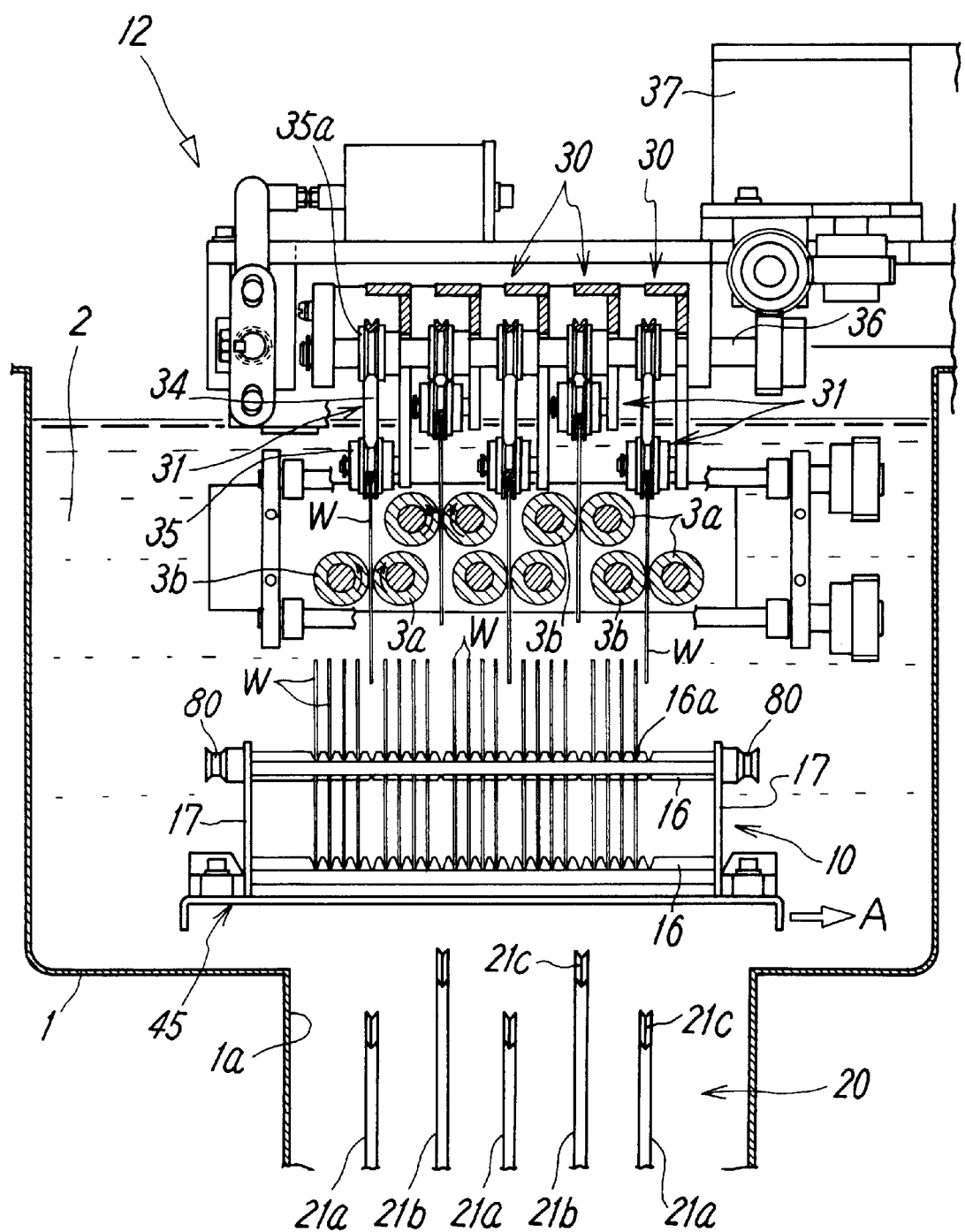
FIG. 3 is a partially enlarged view of FIG. 2.
Figure 7:
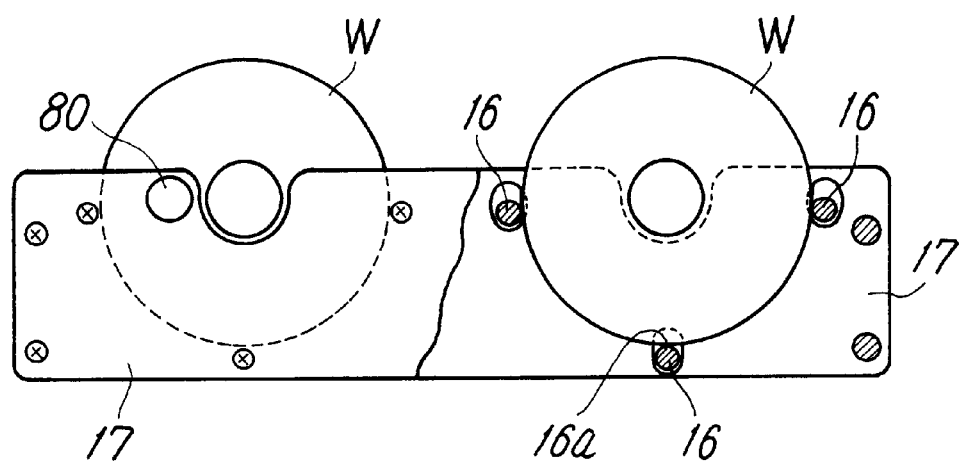
FIG. 7 is a partially cutaway side view of the carrier.

As can be understood from FIGS. 3 and 7, the carrier 10 has a configuration in which a plurality of workpieces W can be arranged at prescribed intervals longitudinally and in parallel with the flow of the solution and mounted by attaching three supporting rods 16 in a set having a plurality of grooves for engagement with the outer periphery of the workpieces W between a right side plate 17 and a left side plate 17 so that the center supporting rod 16 is at a position lower than that of the other supporting rods 16. In this configuration, front and rear rows of workpieces W can be mounted by providing two sets of supporting rods 16 as described above at front and rear positions in the transfer direction of the carrier. In the example shown, the configuration permits mounting of 50 workpieces in total, including two rows each comprising 25 workpieces.

A lifting mechanism 20 which extracts a plurality of workpieces W to be washed as a group from the two front and rear rows of workpieces held by the carrier 10 and lifting the extracted group of workpieces to the respective washing positions is provided in the washing section 12. This lifting mechanism 20 has a plurality of lifting arms 21 arranged at prescribed intervals along the individual rows of workpieces, and these lifting arms 21 are attached to an arm substrate 22 in the form of two front and rear rows. Each lifting arm 21 is branched into two to avoid the center supporting rod 16 among the three supporting rods 16 supporting the works W. The upper end of each branch has a supporting groove 21c (see FIG. 3) engaging with the lower-end outer periphery of the workpiece W held horizontally by the carrier 10 so as to push up the workpieces W from the carrier 10 while they are engaged in the supporting groove 21c. The heights of the individual lifting arms 21 are not uniform, but shorter lifting arms 21a and taller lifting arms 21b are alternately arranged so that the works W are pushed up to the washing positions set at alternately high and low heights. Hereinafter, these are represented by a common reference numeral "21" except when it is necessary to discriminate the shorter lifting arms 21a from the taller lifting arms 21b.

Figure 2:
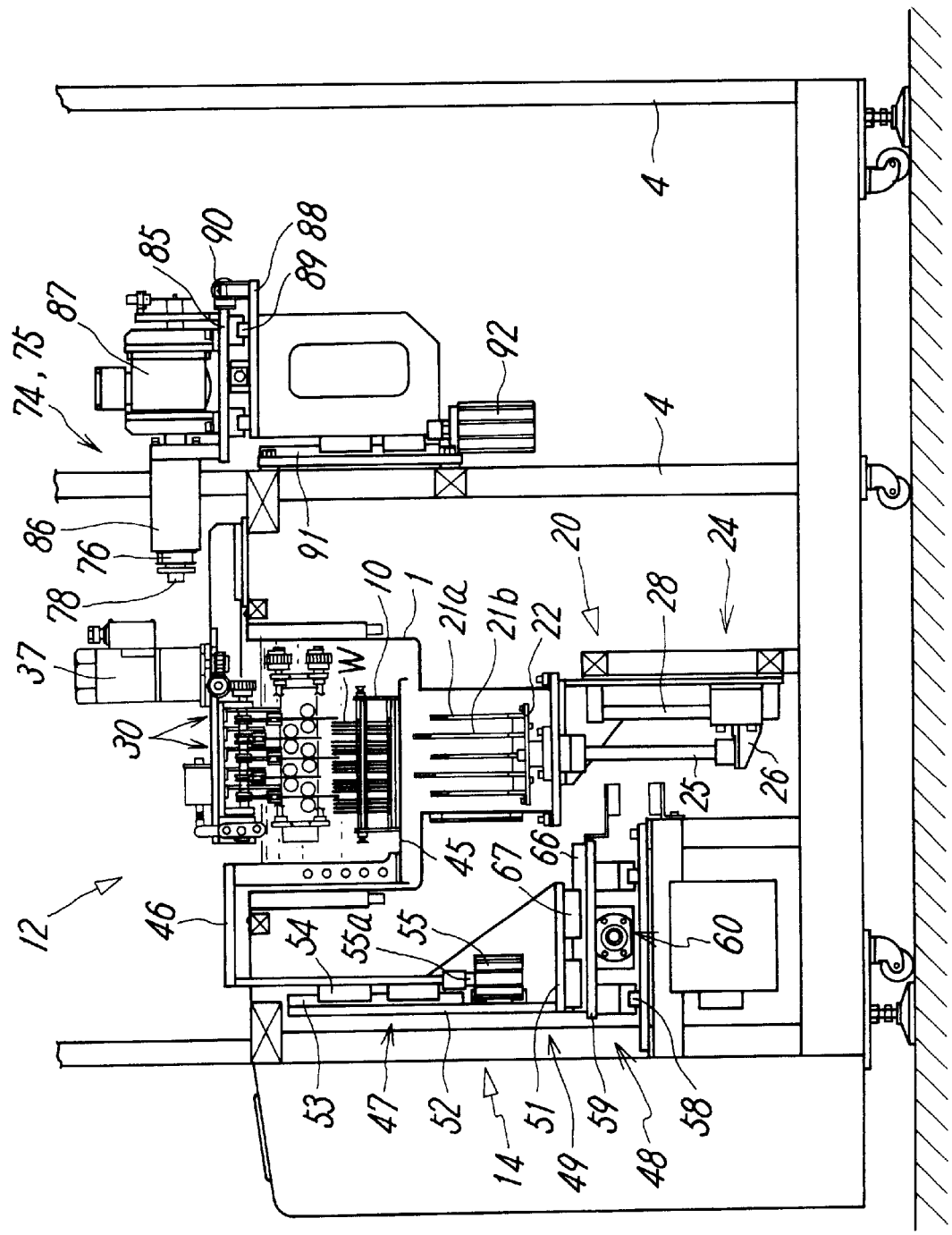
FIG. 2 is a side view from the right illustrating the washing apparatus shown in FIG. 1 cut away at the position of the washing section.

In the example shown, five lifting arms 21 are provided along each of the two rows of workpieces with a spacing between each arm equal to five workpieces. Sequentially from one end of the row (right side in FIGS. 2 and 3), the first, third and fifth lifting arms 21a are formed shorter, and the second and fourth lifting arms 21b are formed taller.

The arm substrate 22 is liftably arranged within a recess 1a provided on the bottom of the washing tank 1 and is liftable by an arm lifting mechanism 24, thus permitting synchronous lifting and lowering of all the lifting arms 21. The arm lifting mechanism 24 comprises a lifting rod 25 extending water-tightly through the bottom of the washing tank 1 from the arm substrate 22, a lifting platform 26 attached to the lower end of the lifting rod 25, a driving source (not shown) such as a motor or an air cylinder lifting the lifting platform 26, and a rail 28 guiding lifting of the lifting platform 26.

A washing mechanism 30 for individually washing the lifted workpieces W is provided for each of the workpiece washing positions. The washing mechanism 30 has driving means 31 which comes individually into contact with the upper periphery of the lifted workpiece W and forcedly rotates the workpiece around the axial line in the washing solution 2, and the pair of drivable and rotatable washing rollers 3a and 3b which wash the workpiece W in the washing solution 2 while holding the rotating workpiece W from both sides thereof. These driving means 31 and the washing rollers 3a and 3b are set at the washing positions at alternately small and large heights in response to the heights of the washing positions. In the example shown, the driving means 31 and the washing rollers 3a and 3b at the first, third and fifth washing positions sequentially from right in FIG. 3 are set at lower positions, and the driving means 31 and the washing rollers 3a and 3b at the second and fourth washing positions are set at higher positions. Adjacent washing rollers 3a and 3b at adjacent washing positions are arranged so as to overlap each other one above the other. It is possible to reduce the interval between adjacent washing mechanisms 30 and 30 by arranging the washing rollers 3a and 3b in such a positional relationship, thus permitting an increase in the number of workpieces W which can be washed at a time.

The driving means 31 comprises an endless driving belt 34. As can be understood from FIGS. 4 and 5, the driving belt 34 is hooked around a pulley 35 having a plurality of (three) grooves so as to be driven in the circumferential direction and comes into linear contact with the upper-end outer periphery of the lifted workpiece W in a curve along the circumference thereof. The driving belt 34, made of a material soft and frictional enough not to damage the workpiece W, such as rubber, a synthetic rubber, or a synthetic resin, has a circumferential recess 34a provided on the outer periphery thereof, and comes into contact with the outer periphery of the work at this recess 34a portion.

As compared with the conventional driving method bringing a small-diameter driving roller into point contact with the work, it is possible to positively transfer a driving force of the driving belt 34 to the workpiece W, and ensure rotation of the workpiece W with a greater driving force by using the endless driving belt 34 for driving the workpiece W and causing linear contact of this driving belt 34 with the outer periphery of the workpiece W. The driving belt, being made of a soft material and being in linear contact with the workpiece W, never damages the workpiece W.

Among the plurality of pulleys 35 around which the driving belt 34 is hooked, the one located at the vertex is a driven pulley 35a. The driven pulleys 35a for the individual driving belts 34 positioned in the same row are arranged at the same height and attached to a common driving shaft 36, so that the driven pulleys 35a are driven by a single driving motor 37 via a transmitting mechanism (not shown) through this driving shaft 36. The other follower pulleys 35 of the individual driving belts 34 are installed alternately at different heights in response to the heights of the washing positions so that the portions of the individual driving belts 34 in contact with the workpiece W are alternately at different heights.

The washing rollers 3a and 3b are, on the other hand, arranged horizontally so as to cross the center portion of the workpiece W in the diameter direction at positions facing each other with the workpieces W directly below the driving belts 34 in between. Each of the washing rollers 3a and 3b are formed by attaching a washing member made of a spongy or fibrous material or a soft material having washing ability into a necessary thickness around a hard core comprising a metal or a synthetic resin, and wash both sides of the workpieces W by rotating while holding the workpieces W from both sides.

On the other hand, the pair of washing rollers 3a and 3b are formed into a length sufficient to cross the workpieces W of both the front and rear rows so as to simultaneously hold the workpieces W of the front row and the workpieces W of the rear row which are lifted to the same height in between and wash them. Both ends of each of the pair of washing rollers 3a and 3b are rotatably supported by bearing members 40, and are driven by different driving motors 41a and 41b via transmitting mechanisms 42a and 42b. More specifically, the washing rollers 3a washing the first sides of the workpieces W are driven by the first driving motor 41a via the transmitting mechanism 42a such as a gear, and the washing rollers 3b washing the second sides of the works W are driven by the second driving motor 41b via the similar transmitting mechanism 42b.

Figure 4:
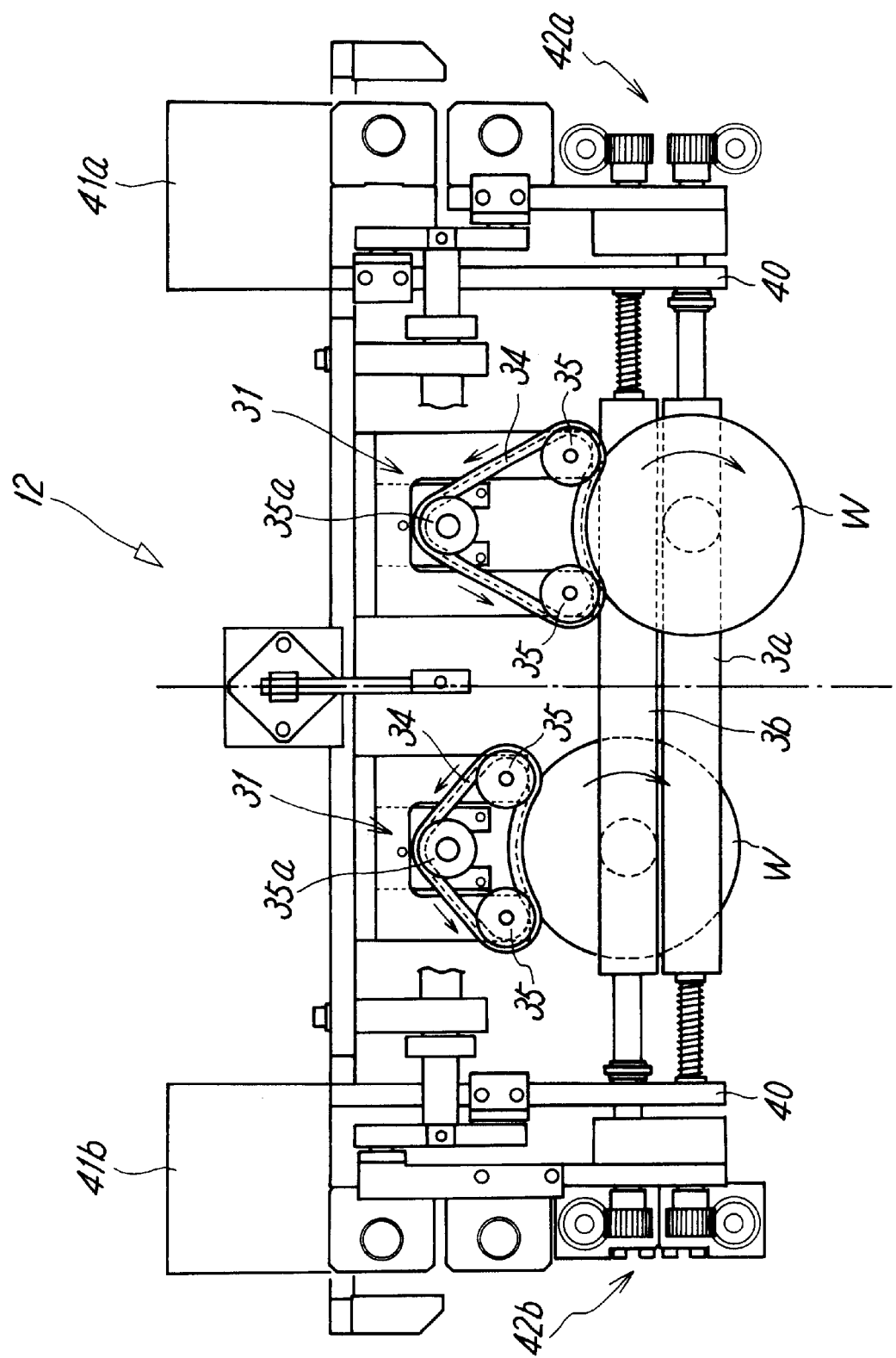
FIG. 4 is a partially enlarged view of FIG. 1.
Figure 5:
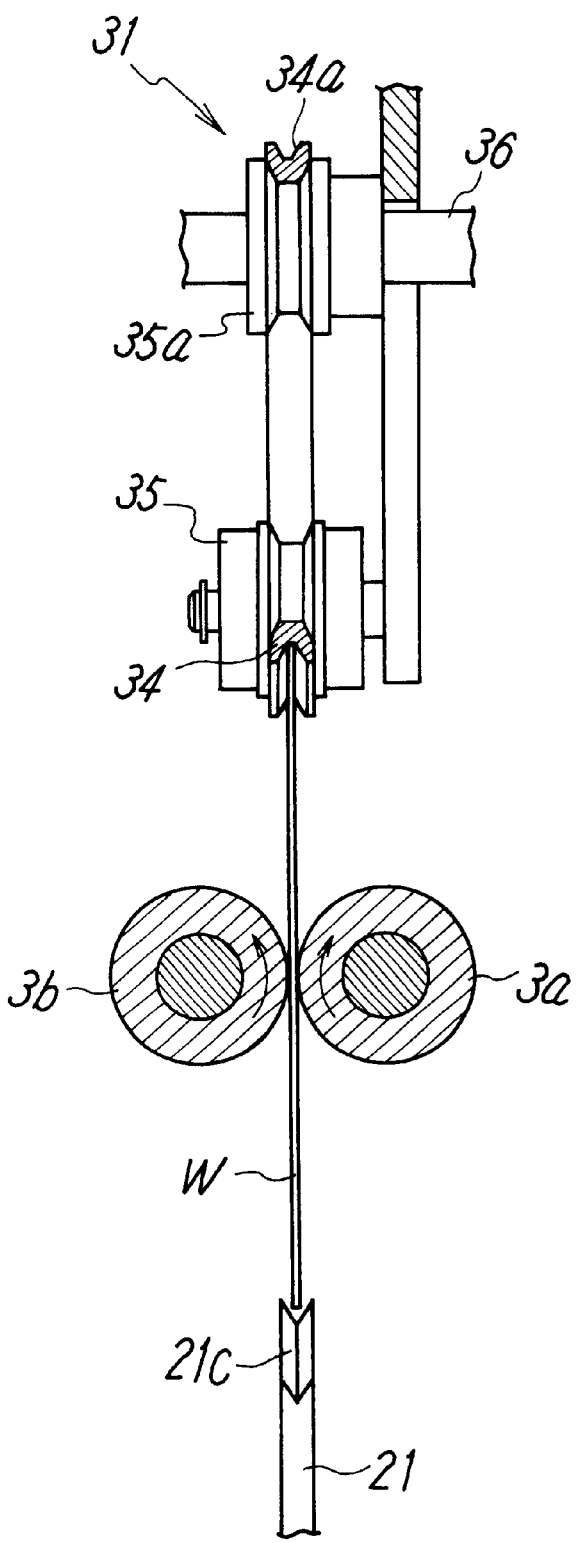
FIG. 5 is a partially enlarged view of FIG. 3.

For the washing section 12 shown in FIGS. 1 and 4, the washing mechanism 31 at the lower position is shown in the right-hand half of the drawing and the washing mechanism 31 at the higher position is shown in the left-hand half. Actually, however, the front and rear washing mechanisms 31 and 31 corresponding to each other are positioned at the same height.

The rotation of the washing rollers 3a and 3b is in a direction such that the workpiece W is lifted by the rotation force thereof. As a result, the workpiece W is pushed up from the lifting arm 21 by the rotational force of the pair of washing rollers 3a and 3b and is pressed against the driving belt 34 from below. That is, the washing rollers 3a and 3b serve also as pressing means for pressing the work W against the driving belt 34.

As a result of the simultaneous use of the washing rollers 3a and 3b as pressing means, it is not necessary to provide a special supporting roller for rotatably supporting the workpiece W during washing, thus leading to a simpler configuration of the washing apparatus. Furthermore, a larger face pressure (pressing force) of the washing rollers 3a and 3b onto the workpiece W permits the workpiece W to be pressed against the driving belt 34 much more strongly, making it possible for the workpiece to be driven by the driving belt 34 more positively. Simultaneously with this, there is also the additional effect of improving the washing effect by the washing rollers 3a and 3b.

The pairs of washing rollers 3a and 3b can be brought closer to or spaced apart from each other by displacing the bearing member 40 by the use of driving means such as an air cylinder or a motor to appropriately change the washing pressure.

The transfer mechanism 14 transferring the carrier 10 comprises a mounting table 45 for the carrier positioned in the washing tank 2, a mounting table arm 46 extending outside the washing tank 1 from the mounting table 45, a mounting table lifting mechanism 47 for lifting the mounting table 45 via the mounting table arm 46, a mounting table moving mechanism 48 for moving the mounting table 45 along the washing tank 1, and an intermittent feed mechanism 49 which, upon washing the workpieces W at the position of the washing section 12, causes intermittent displacement of the mounting table 45 by a prescribed distance in the width direction of the washing tank, i.e., in a direction along the rows of workpieces on the carrier 10.

The mounting table lifting mechanism 47 comprises a guide rail 53 attached to a supporting frame 52 provided upright on a first movable table 51 and extending vertically, a slider 54 attached to the mounting table arm 46 and slidably engaging with the guide rail 53, and an air cylinder 55 attached to the supporting frame 52. A rod 55a of the air cylinder 55 is connected to the mounting table arm 46, and the mounting table arm 46 is moved up and down along the guide rail 53 with the air cylinder 55 as a driving source.

The mounting table moving mechanism 48 comprises a guide rail 58 attached to the apparatus body 4 and extending in parallel with the washing tank 1, a second movable table 59 movable on the guide rail 58 along the washing tank 1, and driving means 60 for causing the second movable table 59 to move. The first movable table 51 for supporting the mounting table arm 46 is mounted on the second movable table 59 via the intermittent feed mechanism 49. The driving means 60 comprises a ball screw 61 provided in parallel with the guide rail 58 on the apparatus body 4, a motor 62 rotatably driving the ball screw 61, and a nut member 63 attached to the second movable table 59 and engaging with the ball screw 61. When the ball screw 61 is rotated by the motor 62, the nut member 63 is displaced along the ball screw 61, whereby the second movable table 59 moves on the guide rail 58 along the washing tank 1.

The intermittent feed mechanism 49 comprises a guide rail 66 attached to the second movable table 59 and extending in the width direction of the washing tank 1, a slider 67 attached to the lower side of the first movable table 51 and engaging slidably with the guide rail 66, and driving means 68 causing the first movable table 51 to move along the guide rail 66. The driving means 68 comprises, although not shown, a ball screw driven by a motor attached on the second movable table 59, and a nut member attached to the first movable table 51 and engaging with the ball screw, as in the aforementioned driving means 60. When the mounting table 45 moves to the washing section 12 and the workpieces W on the carrier are sequentially extracted and washed, the driving means 68 intermittently moves the mounting table 45, i.e., the carrier 10, along the row of workpieces by a distance equal to the spacing between parallel workpieces W.

Figure 6:
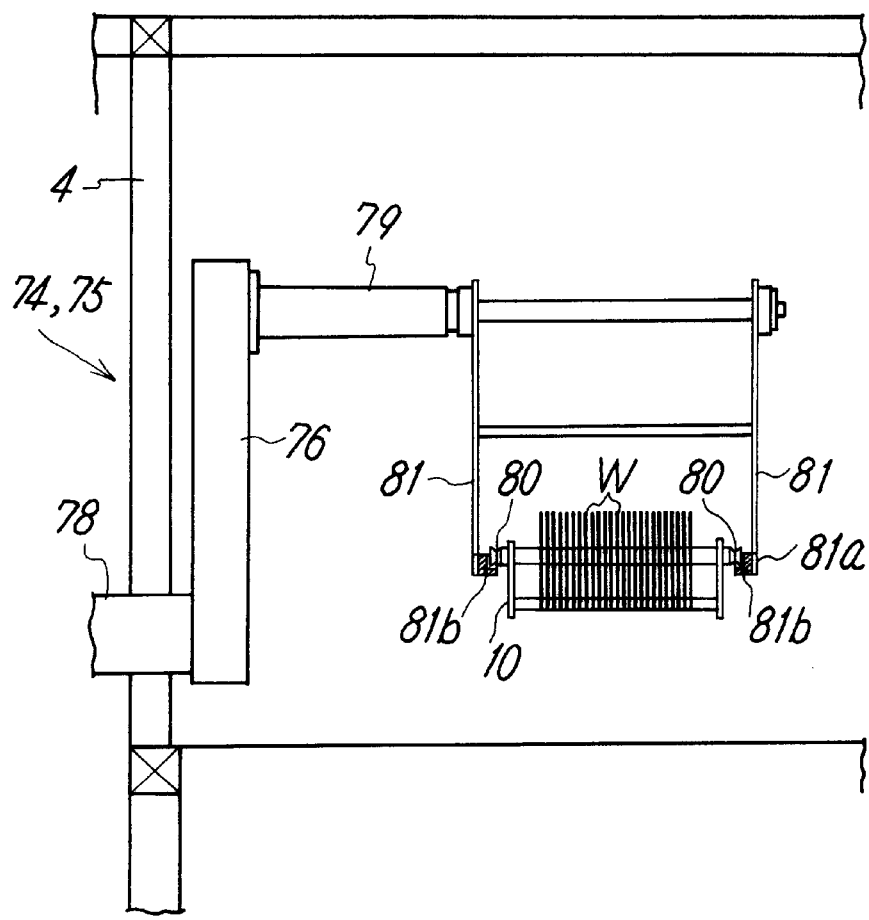
FIG. 6 is a side view of the transfer in/out mechanism of the carrier.

A transfer-in mechanism 74 for feeding the carrier 10 having the workpieces W to be washed mounted therein from a feed conveyor onto the mounting table 45 located at the downstream end of the washing tank 1 is provided on the loading section 11. A transfer-out mechanism 75 for removing the carrier 10 having the washed workpieces W mounted therein from the mounting table 45 at the upstream end of the washing tank 1 onto a transfer-out conveyor is provided on the unloading section 13. These transfer-in mechanism 74 and transfer-out mechanism 75 each have a swinging arm 76 of the same structure. As can be understood from FIGS. 1, 2 and 6, the swinging arm 76 is supported by a supporting shaft 78 at the base thereof on the side of the washing tank 1 to be rotatable by 180° and movable in a direction along the washing tank 1 and in the up-down direction. More specifically, the supporting shaft 78 is rotatably supported by a bearing member 86 on a first movable table 85 and can be driven by a motor 87 mounted on the first movable table 85. The first movable table 85 is movable along a guide rail 89 provided in a direction along the washing tank 1 on a second movable table 88, and moves transversely by driving means 90 such as a motor. Furthermore, the second movable table 88 is liftable along a guide rail 91 attached vertically to the apparatus body 4, and is vertically driven by driving means 92 such as an air cylinder.

A suspension supporting shaft 79 extending horizontally toward the washing tank 1 side is attached to the leading end of the swinging arm 76. A pair of suspended members 81 and 81 engaging with hooks 80 on both outer sides of the carrier 10 are attached to this suspension supporting shaft 79 perpendicularly with a gap slightly larger than the length of the carrier 10. Each of these suspended members 81 and 81 has an inverted T shape and has stopper sections 81b at positions closer to both ends of a horizontal portion 81a at the lower end thereof. The carrier 10 is suspended by hooking the hook 80 onto the stopper section 81b from below. The supporting shaft 78 and the suspension supporting shaft 79 are connected to each other with a timing belt, so that the suspended members 81 and 81 always remain perpendicular irrespective of the swinging position of the swinging arm 76. This makes it possible to transfer the carrier 10 while maintaining it in a horizontal position.

In the drawing, 84 represents ultrasonic irradiating means provided at the bottom of the tank at the upstream end and at the downstream end of the washing tank.

In the washing apparatus having the above-mentioned configuration, when the carrier 10 having the workpieces W to be washed mounted therein is suspended by the swinging arm 76 from the feed conveyor of the loading section 11, and is fed onto the mounting table 45 positioned at the downstream end of the washing tank 1, the mounting table 45 is moved by the mounting table moving mechanism 48 to the washing section 12. At this point, the mounting table 45 receives the carrier 10 upon ascending to the middle of the height, then descends close to the bottom of the tank, and moves to the washing section 12.

When the mounting table 45 reaches the washing section 12, the lifting arms 21 are lifted by the arm lifting mechanism 24. A plurality of workpieces W are extracted from the front and rear rows of workpieces mounted on the carrier 10 and are pushed up to respective washing positions. In the example shown, five workpieces W with a spacing of four workpieces, i.e., the first, sixth, eleventh, sixteenth, and twenty-first workpieces W are extracted as a first group of workpieces to be washed, and are lifted to the washing position. The lifted workpieces W are held from both sides thereof by the pairs of rotating washing rollers 3a and 3b. The workpieces W are further pushed up to a position where the upper-end portions thereof are pressed by the rotational force of the washing rollers 3a and 3b against the driving belt 34, and both surfaces of the workpieces W are scrubbed by the washing rollers 3a and 3b in the washing solution 2 while being forcedly rotated by the driving belt 34. Two workpieces W at corresponding positions in the front and rear rows are held and washed by common washing rollers 3a and 3b.

Upon the completion of washing of the first group of workpieces W after the lapse of a certain period of time, rotation of the driving belt 34 and the washing rollers 3a and 3b is discontinued. The workpieces are engaged in the supporting grooves 21c on the lifting arms 21 in standby at the elevated position by releasing the held workpirces by slightly separating the pair of washing rollers 3a and 3b. Then, the lifting arms 21 descend, and the individual workpieces W are housed at the original positions thereof in the carrier 10.

Then, the mounting table 45 moves forward by a distance equal to one spacing between parallel workpieces W along the row of workpieces by the intermittent feed mechanism 49, as shown by the arrow A in FIG. 3. As a result of lifting of the lifting arms 21 at this position, the second, seventh, twelfth, seventeenth, and twenty-second workpieces W are extracted as a second group of workpieces to be washed from the rows of workpieces. The extracted workpieces W are lifted to the washing position and are subjected to scrubbing.

When all the 50 workpieces W are washed by repeating the above-mentioned steps five times, the mounting table 45 retreats and returns to the original position thereof along the rows of workpieces by the action of the intermittent feed mechanism 49. Then, the mounting table 45 moves to the unloading section, where the mounting table 45 is suspended by the swinging arm 76, discharged onto the discharge conveyor, and sent to the next process.

After removal of the carrier 10, the mounting table 45 moves to the loading section at the downstream end in the washing tank 1, and the above-mentioned process is repeated by feeding the carrier 10 having the workpieces W to be washed mounted therein.

While the above-mentioned embodiment has covered a case in which the workpieces W are mounted in two front and rear rows on the carrier 10, the workpieces W may be mounted in a single row or three or more rows. It is also possible to adopt a configuration in which a plurality of carriers having one or more rows of workpieces Wmounted therein are mounted in at least one of the front-rear direction (along the washing tank) and the right-left direction (width direction of the washing tank) on the mounting table 45, and, from the thus mounted workpieces on the carriers, a plurality of workpieces are scrubbed at one time. At all events, it is needless to mention that the number and the manner of installation of the driving belt 34 and the washing rollers 3*a* and 3*b* must meet the number of rows and the number of workpieces.

The flowing-liquid-type washing tank 1 has been described in the aforementioned embodiment. The tank may however be of the stationary-liquid-type in which the solution does not flow during washing, or of the shower-type in which the washing solution 2 is ejected from a nozzle provided in the washing section 12 toward the workpieces W and the washing rollers 3*a* and 3*b*.

According to the present invention, as described above, there is provided an efficient and highly productive roller-type washing apparatus permitting scrubbing of a plurality of workpieces at one time through the washing rollers.

What is claimed is:

1. A disk-shaped-workpiece washing apparatus comprising:
   a carrier which holds a plurality of disk-shaped workpieces in a longitudinal arrangement at predetermined intervals;
   a washing section which scrubs the workpieces held by said carrier sequentially in groups of a plurality of the workpieces; and
   an intermittent transfer mechanism, wherein said washing section comprises:
      a lifting mechanism which lifts the plurality of workpieces to be washed from a row of workpieces held by the carrier in groups of a plurality of the workpieces to corresponding washing positions;
      driving means which are provided at each of said corresponding washing positions, and which forcedly cause the workpieces to rotate around an axes by coming into contact with the upper outer periphery of the lifted workpieces; and
      a pair of drivable and rotatable washing rollers provided for each of said washing positions which washes each workpiece while holding each rotating workpiece in between from both sides thereof; and
      wherein the washing positions of said plurality of workpieces are alternately provided at different heights;
      the driving means and the washing rollers at each washing position are also arranged alternately at different heights; and
      adjacent washing rollers at adjacent washing positions overlap each other one above the other.

2. A washing apparatus according to claim 1, wherein each pair of washing rollers provided at each washing position is arranged horizontally at a position crossing a center portion of the work in the diameter direction, and serves as pressing means for pushing up said workpiece and pressing the workpiece against said driving means by the use of a rotational force acting during washing.

3. A washing apparatus according to claim 1, wherein said driving means comprises an endless driving belt, and a portion of said driving belt in contact with the workpiece curves in the circumferential direction of the workpiece so as to come into linear contact with the outer periphery of the workpiece.

4. A washing apparatus according to claim 1, wherein said lifting mechanism is provided with a plurality of lifting arms; and
   wherein the plurality of lifting arms move up at the same time and down at the same time and are arranged at predetermined intervals under the position where the carrier is provided in the washing section, and a supporting groove engaging with an outer periphery of a lower end of the workpiece held upright by the carrier is provided at the upper end of each lifting arm.

5. A washing apparatus according to claim 1, wherein said washing apparatus comprises a washing tank filled with a washing solution, and said carrier and the washing rollers are immersed in the washing solution in said washing tank so as to permit washing of said workpiece in said washing solution.

6. A disk-shaped-workpiece washing apparatus comprising:
   a carrier which holds a plurality of disk-shaped workpieces in a longitudinal arrangement at predetermined intervals;
   a washing section which scrubs the workpieces held by said carrier sequentially in groups of a plurality of the workpieces; and
   an intermittent transfer mechanism, wherein said washing section comprises:
      a lifting mechanism which lifts the plurality of workpieces to be washed from a row of workpieces held by the carrier in groups of a plurality of the workpieces to corresponding washing positions;
      driving means which are provided at each of said corresponding washing positions, and which forcedly cause the workpieces to rotate around an axes by coming into contact with the upper outer periphery of the lifted workpiece; and
      a pair of drivable and rotatable washing rollers provided for each of said washing positions which washes each workpiece while holding each rotating workpiece in between from both sides thereof;
      wherein the washing positions of said plurality of workpieces are alternately provided at different heights, the driving means and the washing rollers at each washing position are also arranged alternately at different heights, and adjacent washing rollers at adjacent washing positions overlap each other one above the other; and
      wherein each pair of washing rollers provided at each washing position is arranged horizontally at a position crossing a center portion of the workpiece in the diameter direction, and serves as pressing means for pushing up said workpiece and pressing the workpiece against said driving means by the use of a rotational force acting during washing.

7. A washing apparatus according to claim 6, wherein said driving means comprises an endless driving belt, and a portion of said driving belt in contact with the workpiece curves in the circumferential direction of the workpiece so as to come into linear contact with the outer periphery of the workpiece.

8. A washing apparatus according to claim 7, wherein said lifting mechanism is provided with a plurality of lifting arms,
   wherein the plurality of lifting arms move up at the same time and down at the same time and are arranged at predetermined intervals under the position where the carrier is provided in the washing section, and a supporting groove engaging with an outer periphery of the lower end of a workpiece held upright by the carrier is provided at the upper end of each lifting arm.

9. A washing apparatus according to claim 7, wherein said washing apparatus comprises a washing tank filled with a washing solution, and said carrier and the washing rollers are immersed in the washing solution in said washing tank so as to permit washing of said workpiece in said washing solution.

10. A washing apparatus according to claim 6, wherein said lifting mechanism is provided with a plurality of lifting arms, wherein the plurality of lifting arms move up at the same time and down at the same time and are arranged at predetermined intervals under the position where the carrier is provided in the washing section, and a supporting groove engaging with an outer periphery of a lower end of the workpiece held upright by the carrier is provided at the upper end of each lifting arm.

11. A washing apparatus according to claim 6, wherein said washing apparatus comprises a washing tank filled with a washing solution, and said carrier and the washing rollers are immersed in the washing solution in said washing tank so as to permit washing of said workpiece in said washing solution.

* * * * *